United States Patent [19]

Andideh et al.

[11] Patent Number: 5,270,264
[45] Date of Patent: Dec. 14, 1993

[54] PROCESS FOR FILLING SUBMICRON SPACES WITH DIELECTRIC

[75] Inventors: Ebrahim Andideh, Portland; Robert J. Patterson, Beaverton, both of Oreg.

[73] Assignee: Intel Corporation, Santa Clara, Calif.

[21] Appl. No.: 917,465

[22] Filed: Jul. 21, 1992

Related U.S. Application Data

[63] Continuation-in-part of Ser. No. 812,439, Dec. 20, 1991, abandoned.

[51] Int. Cl.$^5$ .......................................... H01L 21/465
[52] U.S. Cl. ..................................... 437/228; 437/238; 437/245; 148/DIG. 158; 204/192.32; 204/192.37
[58] Field of Search ............... 204/192.32, 192.37; 437/225, 228, 238, 245; 148/DIG. 158

[56] References Cited

U.S. PATENT DOCUMENTS 3,617,463 11/1971 Gregor et al. .

FOREIGN PATENT DOCUMENTS 63-131546 6/1988 Japan .

OTHER PUBLICATIONS

Valletta, R., "Control of Edge Profile in Sputter Etching", *IBM Technical Disclosure Bulletin*, vol. 10, No. 12 May 1968.
Kotani, H., et al, "Sputter Etching... Metallization", *J. Electrochem. Soc. & Solid State Science & Tech.*, Mar. 1983 pp. 645–648.
Vossen, J., et al, "Back Scattering... Targets", RCA Review, Jun. 1970, vol. 31, No. 2, pp. 293–305.
Wolf, S. et al, *Silicon Processing for the VLSI Era; vol. 1, Process Technology*, Lattice Press, 1986 pp. 343–344.

*Primary Examiner*—George Fourson
*Attorney, Agent, or Firm*—Blakely, Sokoloff, Taylor & Zafman

[57] ABSTRACT

A process for filling submicron, high aspect ratio gaps, that may have reentrant angles, with a high quality ILD. A first ILD layer is deposited using PECVD to partially fill the gap. Medium-pressure sputter etching is then used to remove the bread-loaf edges and redeposit the etched material in the gaps, thereby allowing small gaps with high aspect ratios and reentrant angles to be completely filled. Finally, a second ILD layer that completely fills the gap is deposited using PECVD.

19 Claims, 6 Drawing Sheets

Fig. 8
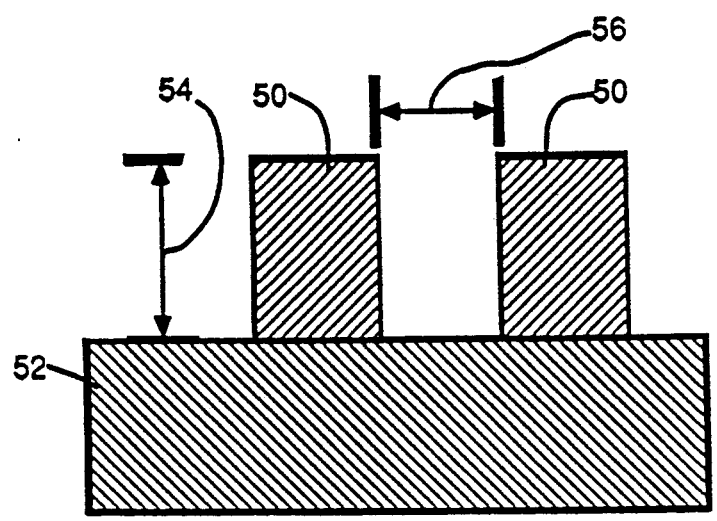
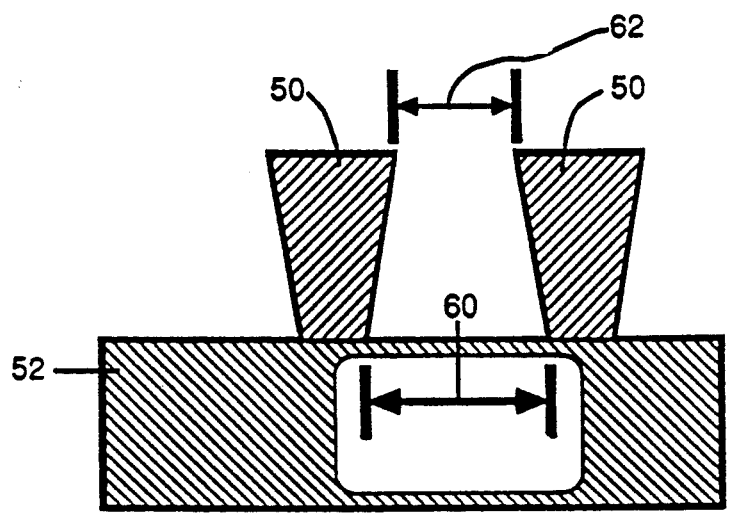
Fig. 9

PROCESS FOR FILLING SUBMICRON SPACES WITH DIELECTRIC

This is a continuation-in-part of application Ser. No. 07/812,439, filed on Dec. 20, 1991, now abandoned.

BACKGROUND OF THE INVENTION

1. Field of the Invention

The present invention relates to the manufacture of high performance VLSI semiconductor chips in general and, more specifically, to an improved method for depositing an inter-layer dielectric (ILD) on metal lines on semiconductor wafers and in the gaps between adjacent metal lines such that submicron-wide gaps that may have imperfect geometries are completely filled by the ILD according to a chemical vapor deposition (CVD) and medium-pressure sputter etch technique. The above method may find extensive use in the fabrication of multilevel metal semiconductor structures.

2. Description of the Prior Art

There is a constant drive in the processing of semiconductor wafers to increase the density of devices on each die on a semiconductor wafer in order to enhance chip performance and lower manufacturing costs. Increasing the density of devices on each die on a semiconductor wafer enhances chip performance in three ways: first, more complex circuits can be implemented with the additional devices provided by a denser manufacturing technology; second, smaller transistor gates increase device speed; and third, smaller distances between devices decrease the signal propagation delay between devices, thereby improving the speed performance of the chip. Manufacturing costs are lowered because a denser manufacturing technology allows more chips to be produced for each wafer that is manufactured.

As the circuits integrated on semiconductor wafers have become more complex, the interconnecting of the transistors has limited manufacturability. Multilevel metal technology was developed to allow more complex interconnection schemes. Silicon dioxide is typically used as the ILD insulator between multiple metal layers. Multilevel metal technology has an inherent problem that the ILD deposited on the first metal layer must provide a sufficiently planar surface for the next metal layer. As even denser circuits have become desirable, the distances between adjacent metal lines in multilevel metal technology have been pushed into the submicron range. In the submicron range the ability of the ILD to completely fill the gaps between adjacent metal lines becomes a problem. Complete gap filling is necessary to prevent chip failures caused by discontinuities in the ILD between adjacent metal lines.

An ILD deposition process for multilevel metal, submicron metal-gap technology must be selected based on how well it overcomes the problems of gap filling and planarity. Another important consideration is the quality of the ILD as an electrical insulator. Two ILD processes that have been developed for multilevel metal technology are: spin on glass (SOG), and CVD.

SOG was first used in two-level metal technologies with metal line gaps larger than one micron. The limited planarity of SOG and its inability to fill submicron gaps reliably have restricted its use in processes having more than two layers of metal or having submicron metal-gaps. SOG is limited to two-layer metal processes because the SOG surface is not sufficiently planar for additional layers. SOG is not commonly used in submicron metal-gap processes because it does not fill submicron metal-gaps very well. Even when SOG fills a submicron metal-gap, it will usually crack and create reliability problems. Because of the limitations of SOG, other ILD deposition processes have been developed for multilevel metal, submicron metal-gap technology.

An ILD deposited using CVD is often preferred over SOG when ILD quality and multilevel metal capability are considered. CVD deposited ILDs are better, more reliable electrical insulators than SOG. However, CVD deposited ILDs, in general, are even less planar than SOG. This has not limited the use of CVD deposited ILDs because the planarity problem can be solved with an additional planarization process following the gap filling process. Some planarization processes that can be used with CVD ILDs are: photoresist etchback, an additional SOG layer (see U.S. Pat. No. 4,775,550), or chemical-mechanical polishing of the ILD surface (see U.S. Pat. No. 4,944,836). With the additional planarization processing, CVD ILD technology provides a higher quality, more planar ILD than SOG alone.

Two common CVD processes are thermal chemical vapor deposition (TCVD) and plasma enhanced chemical vapor deposition (PECVD). TCVD produces an ILD that fills small gaps, but is low quality because it is porous and contains moisture. PECVD does not fill gaps as well as TCVD, but it provides a high quality, moisture-free oxide. The prior art uses various combinations of TCVD and PECVD in an effort to completely fill small metal-gaps while achieving satisfactory oxide quality.

As the gaps between metal lines shrink to submicron sizes, both TCVD and PECVD exhibit gap filling problems. The prior art improves the gap filling capability of CVD processes by adding etch steps to the CVD ILD deposition process and filling the gap incrementally. Two common etching processes are plasma etching with $CF_4$ and low-pressure argon sputter etching. Both etching processes etch a CVD deposited ILD layer and widen the upper portion of the gap, thereby allowing a subsequent CVD deposited ILD layer to continue filling the remaining gap. Plasma $CF_4$ etching is a chemical process whereas argon sputter etching is a physical process. Argon sputter etching is more effective at widening the gap than $CF_4$ plasma etching.

As shown in FIG. 1, a typical prior art CVD ILD process for submicron metal-gap, multilevel metal technology comprises the steps of: (1) CVD ILD deposition(s) 10, (2) plasma and/or low-pressure sputter etch(s) 12, (3) CVD ILD deposition(s) 14, (4) plasma and/or low-pressure sputter etch(s) 16, and (5) CVD ILD deposition 18. Other typical variations of the prior art ILD deposition process use TCVD combined with PECVD and etching. The prior art process allows gaps as small as 0.8 um, with aspect ratios of 1.0 or less, without reentrant angles, to be reliably filled. However, the prior art process improves gap filling at the expense of lower oxide quality, transistor damage caused by traps and gate-charging, and increased manufacturing costs due to the additional CVD ILD deposition, plasma etch, and low-pressure sputter etch steps.

SUMMARY OF THE INVENTION

The present invention describes an improvement to a process for filling gaps between adjacent metal lines on a semiconductor wafer. The present invention describes the steps of depositing a first ILD layer using CVD, medium-pressure sputter etching the first ILD layer such that a substantial amount of the etched ILD material is redeposited in the gaps, and depositing a second ILD layer using CVD such that the gaps between the metal lines are completely filled.

BRIEF DESCRIPTION OF THE DRAWINGS

FIG. 8 is a cross-sectional view of two adjacent metal lines formed on a semiconductor wafer illustrating that the gap formed between adjacent metal lines has an aspect ratio defined as gap height divided by gap width.

FIG. 9 is a cross-sectional view of two adjacent metal lines formed on a semiconductor wafer illustrating that a gap formed between adjacent metal lines has a reentrant angle when the upper gap width is smaller than the lower gap width.

DETAILED DESCRIPTION OF THE PREFERRED EMBODIMENT

In the following description, numerous specific details are set forth, such as gap widths, aspect ratios, etc., in order to provide a thorough understanding of the present invention. It will be obvious, however, to one skilled in the art that the present invention may be practiced without these specific details. In other instances, well-known processing steps have not been described in detail in order not to unnecessarily obscure the present invention.

For simplicity, FIGS. 8-13 show metal lines formed directly on a semiconductor wafer. It is understood that in practice there are other layers between the semiconductor wafer and the metal lines. This does not limit the practice of the present invention.

The general problem addressed by the present invention is the filling of submicron, high aspect ratio gaps between adjacent metal lines with a high quality ILD, wherein the gaps may have reentrant angles. As shown in FIG. 8, the aspect ratio of a gap between metal lines is defined as the gap height 54 divided by the gap width 56. As shown in FIG. 9, a gap with a reentrant angle is defined as one that has an upper width 62 that is smaller than the bottom width 60. The width, aspect ratio, and reentrant angle of a gap are the limiting factors in the capability of an ILD process to fill submicron metal-gaps.

Figure 1:
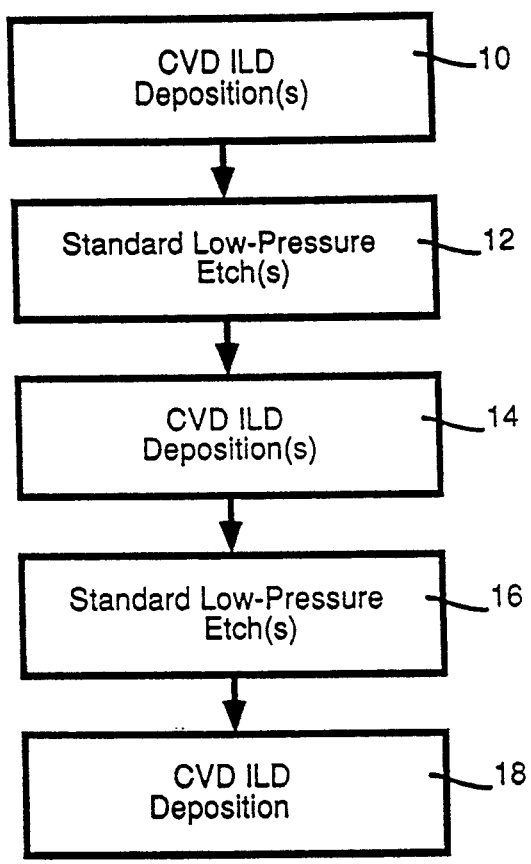
FIG. 1 graphically illustrates an example of the steps of a typical prior art ILD deposition process.
Figure 2:
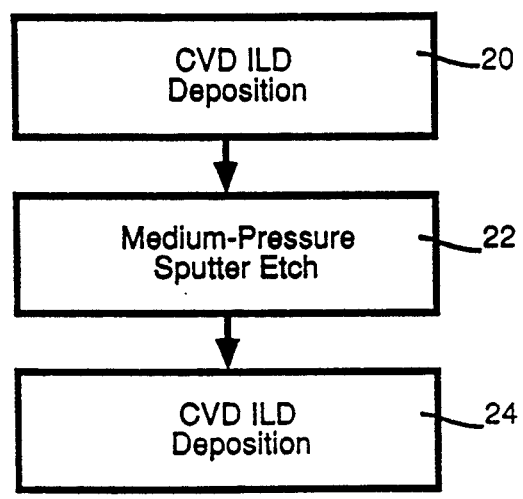
FIG. 2 graphically illustrates the steps of the ILD deposition process of the present invention.

The improvement of the present invention comprises using a medium-pressure noble gas sputter etch such that even submicron gaps smaller than 0.8 um having aspect ratios greater than 1.0, with or without reentrant angles, are completely filled with a high quality ILD in the three steps, illustrated in FIG. 2, of: (1) CVD ILD deposition 20, (2) medium-pressure sputter etch 22, and (3) CVD ILD deposition 24.

Figure 3:
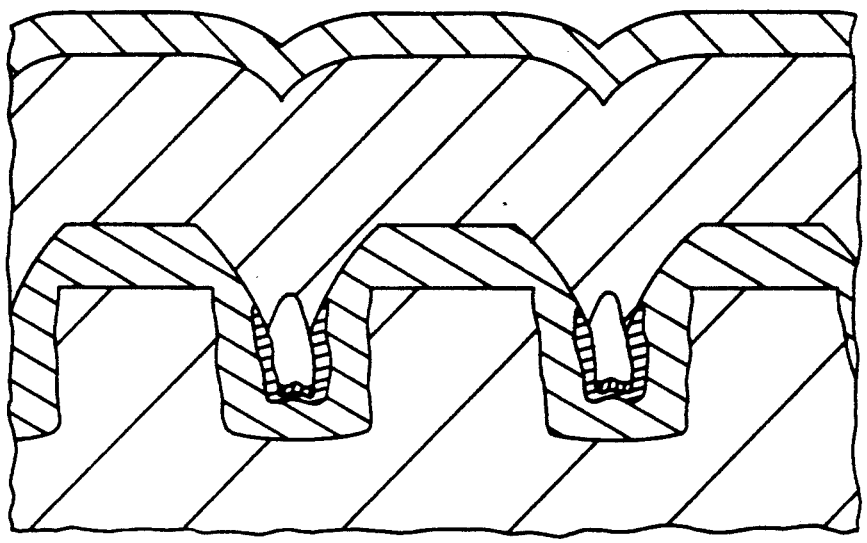
FIG. 3 is a photograph of a cross-section of a semiconductor wafer showing that a three step process of: (1) CVD ILD deposition, (2) low-pressure argon sputter etch, and (3) CVD ILD deposition fails to completely fill 0.88 um gaps. The gaps have aspect ratios greater than 1.0.

FIG. 3 illustrates incomplete filling of 0.88 um gaps when using a low-pressure argon sputter etch in the steps of: (1) CVD ILD deposition, (2) low-pressure (about 30-40 mTorr) argon sputter etch, and (3) CVD ILD deposition. The gaps have aspect ratios greater than 1.0.

Figure 4:
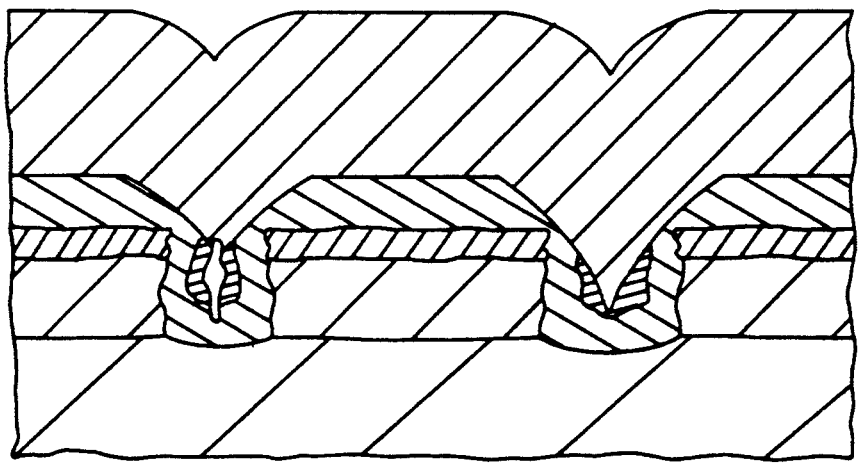
FIG. 4 is a photograph of a cross-section of a semiconductor wafer showing that the three step process of the present invention of: (1) CVD ILD deposition, (2) medium-pressure argon sputter etch, and (3) CVD ILD deposition completely fills gaps smaller than 0.70 um having aspect ratios greater than 1.0.

FIG. 4 illustrates complete filling of smaller than 0.70 um gaps when using a medium-pressure argon sputter etch in the three steps of: (1) CVD ILD deposition, (2) medium-pressure (about 80-200 mTorr) argon sputter etch, and (3) CVD ILD deposition. The gaps have aspect ratios greater than 1.0.

The improvement of the present invention also comprises using a medium-pressure sputter etch with other noble gases besides argon in the three step process to fill gaps even smaller than 0.70 um between metal lines.

Figure 5:
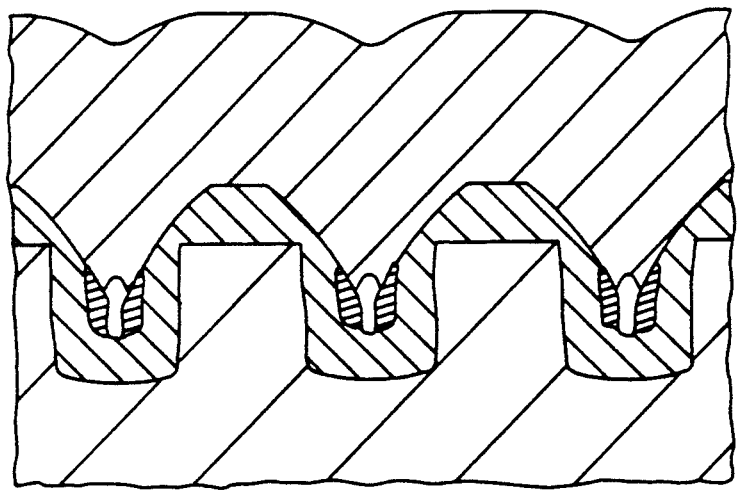
FIG. 5 is a photograph of a cross-section of a semiconductor wafer showing that a three step process of: (1) CVD ILD deposition, (2) medium-pressure argon sputter etch, and (3) CVD ILD deposition fails to completely fill 0.66 um, 0.68 um, and 0.68 um gaps between metal lines. The gaps have aspect ratios greater than 1.0.

FIG. 5 illustrates incomplete filling of 0.66 um, 0.68 um, and 0.68 um gaps when using a medium-pressure argon sputter etch in the three steps of: (1) CVD ILD deposition, (2) medium-pressure (about 80-200 mTorr) argon sputter etch, and (3) CVD ILD deposition. The gaps have aspect ratios greater than 1.0.

Figure 6:
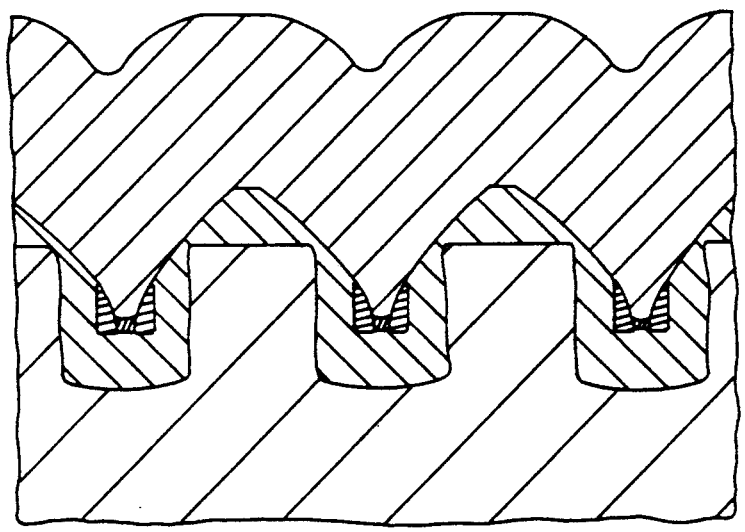
FIG. 6 is a photograph of a cross-section of a semiconductor wafer showing that the three step process of: (1) CVD ILD deposition, (2) medium-pressure krypton sputter etch, and (3) CVD ILD deposition completely fills 0.68 um gaps between metal lines. The gaps have aspect ratios greater than 1.0.

FIG. 6 illustrates complete filling of 0.68 um gaps when using a medium-pressure krypton sputter etch in the three steps of: (1) CVD ILD deposition, (2) medium-pressure (about 80-200 mTorr) krypton sputter etch, and (3) CVD ILD deposition. The gaps have aspect ratios greater than 1.0.

Figure 7:
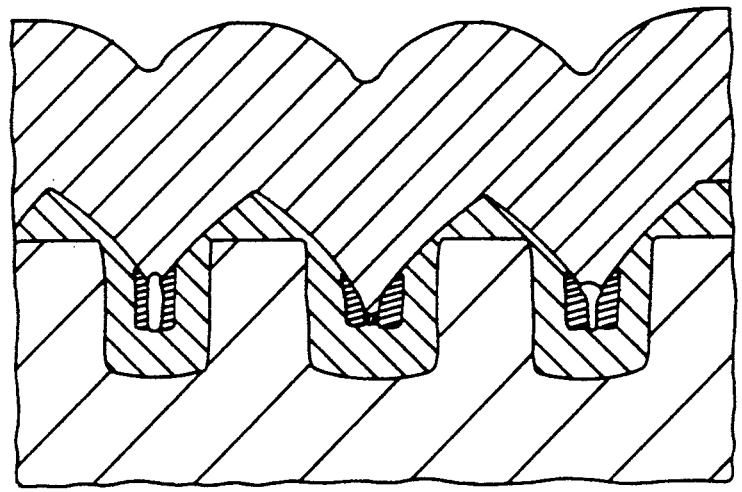
FIG. 7 is a photograph of a cross-section of a semiconductor wafer showing that the three step process of: (1) CVD ILD deposition, (2) medium-pressure xenon sputter etch, and (3) CVD ILD deposition fails to fill 0.55 um and 0.65 um gaps, but completely fills gaps of 0.68 um between metal lines. The gaps have aspect ratios greater than 1.0.

FIG. 7 illustrates incomplete filling of 0.55 um and 0.65 um gaps and complete filling of 0.68 um gaps when using a medium-pressure xenon sputter etch in the three steps of: (1) CVD ILD deposition, (2) medium-pressure (about 80–200 mTorr) xenon sputter etch, and (3) CVD ILD deposition. The gaps have aspect ratios greater than 1.0.

Along with medium-pressure sputter etch with noble gases, the improvement of the present invention also comprises using predetermined ranges of sputter etch power and sputter etch magnetic field in order to minimize transistor damage and optimize the sputter etch rate while achieving complete gap filling in the three steps.

The currently preferred embodiment of the present invention uses PECVD in the CVD ILD deposition steps 20 and 24, and medium-pressure (80–200 mTorr) noble gas sputter etching in etch step 22. In the PECVD ILD deposition of steps 20 and 24, a silicon source such as TEOS or silane is combined with $O_2$ to form silicon dioxide for the ILD layer. Aspects of the currently preferred embodiment of the present invention are: (1) the use of predetermined ranges of sputter etch parameters such that the etched ILD redeposits efficiently in the submicron gaps; (2) the type of silicon sources used in the CVD process are capable of filling submicron gaps when used with the present invention; (3) the type of CVD process used provides a high quality, moisture-free ILD; (4) the use of predetermined ranges of sputter etch parameters such that transistor damage is minimized; and (5) the use of predetermined ranges of sputter etch parameters such that sputter etch rate is optimized.

Transistor damage occurs by the generation of traps in the transistor gate oxide. Sputter etching at high power and high etch chamber self-bias voltages creates oxide traps in the gate oxide of the transistors. Low quality oxides are susceptible to transistor damage caused by gate-charging and the generation of traps.

PECVD provides a better quality oxide than TCVD, but it is less effective at filling submicron gaps. The medium-pressure sputter etch of the present invention enhances the gap-filling capability of CVD processes such that PECVD can be used to obtain a high quality oxide while accomplishing complete filling of submicron gaps. Therefore, the currently preferred embodiment of the present invention uses PECVD in the CVD ILD deposition steps 20 and 24. However, the gap filling capability of other CVD process may be improved by using the medium-pressure sputter etch of the present invention.

Two silicon sources used in PECVD are silane ($SiH_4$) and tetraethylorthosilicate (TEOS). Silane provides a drier oxide than TEOS, but it will not fill as small a gap. TEOS has a molecular shape and size that make it a good choice for PECVD when filling submicron gaps. While silane provides a better quality ILD in PECVD than TEOS, the quality of TEOS ILD is adequate. Since the quality of the TEOS ILD in PECVD is adequate, TEOS is often a better choice than silane for filling submicron gaps because the molecular size and shape of TEOS allow it to fill submicron gaps more effectively. TEOS is used as the silicon source in the currently preferred embodiment of the present invention.

Figure 10:
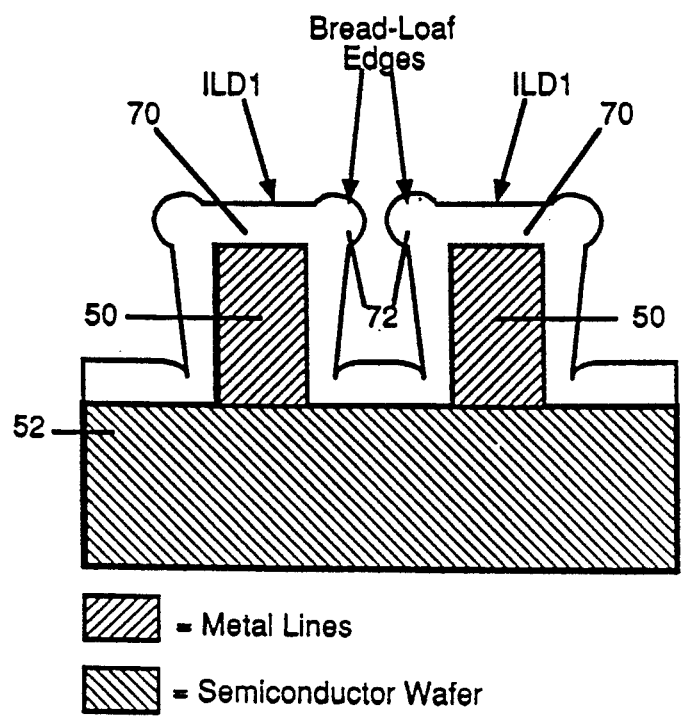
FIG. 10 is a cross-sectional view of two adjacent metal lines formed on a semiconductor wafer with an ILD deposited using CVD illustrating the bread-loafing effect that occurs during CVD.
Figure 11:
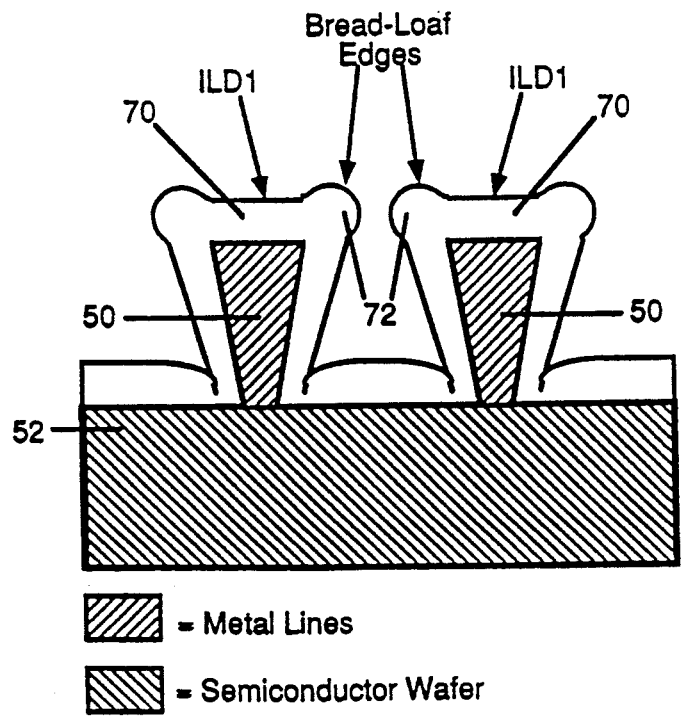
FIG. 11 is a cross-sectional view of two adjacent metal lines having a gap with a reentrant angle formed on a semiconductor wafer with an ILD deposited using CVD illustrating the bread-loafing effect that occurs during CVD.

PECVD using TEOS provides a better quality ILD than TCVD using TEOS, but it has an undesirable bread-loafing effect, as shown in FIGS. 10 and 11, that limits its ability to fill submicron gaps under the prior art CVD ILD processes. The deposition of the first ILD layer, ILD1 70, results in bread-loaf edges 72.

Bread-loafing occurs in PECVD because the molecules deposit silicon dioxide preferentially on the upper corners of the metal lines. This results in thicker deposits on the upper corners of the metal lines that form an overhang structure that looks much like a loaf of bread. The problem created by the bread-loafing is that after the bread-loaf edges form, they block the oxide source molecules from reaching the space underneath the bread-loaf edges. Effectively, the bread-loafing creates a reentrant angle for the gap even if one did not originally exist.

Figure 12:
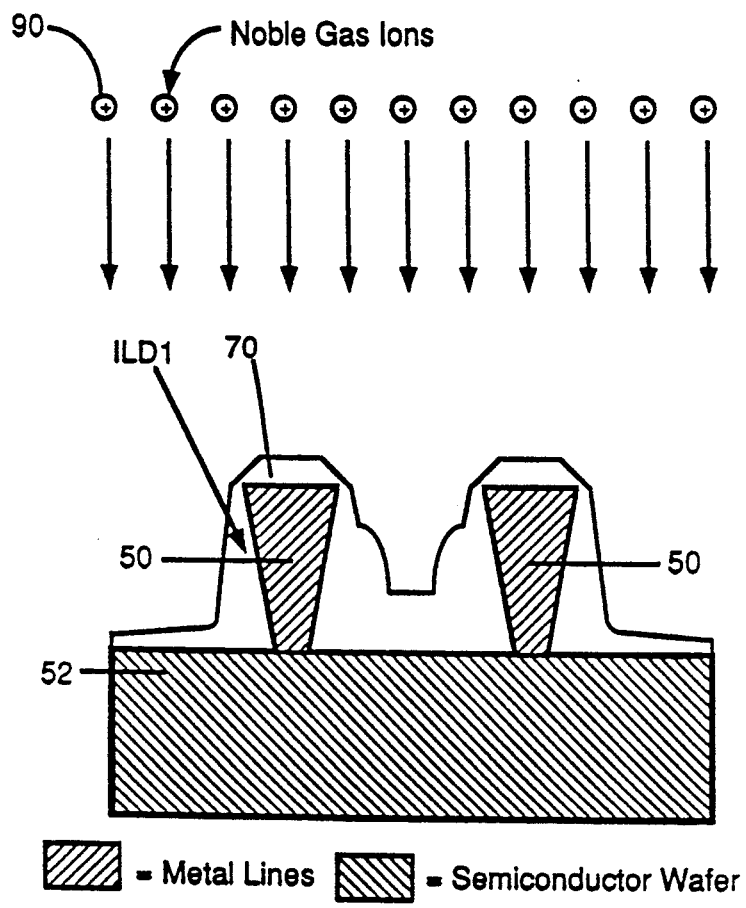
FIG. 12 is a cross-sectional view of FIG. 8 after the ILD layer has been sputter etched with a noble gas at medium-pressure showing the redeposit of the etched material in the gap.
Figure 13:
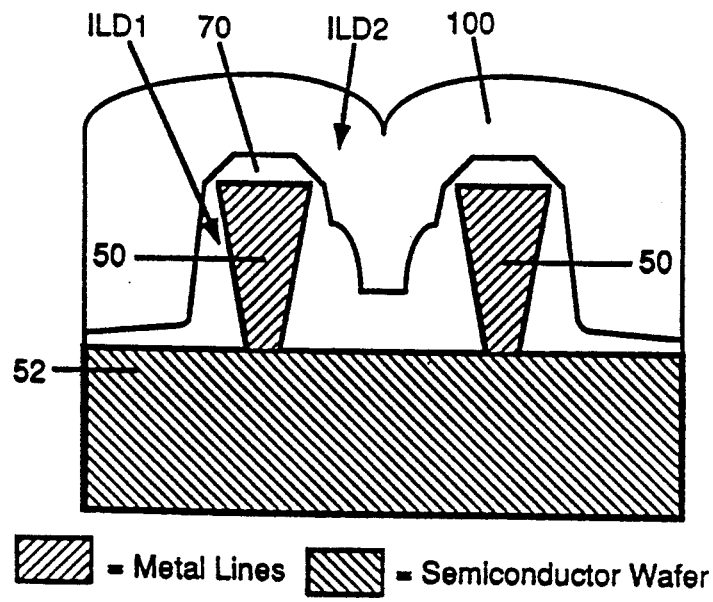
FIG. 13 is a cross-sectional view of FIG. 12 after the additional CVD deposition of the ILD2 layer showing complete gap fill.

The bread-loaf edges also act as a source of oxide to fill the gaps. As shown in FIG. 12, the present invention uses a medium-pressure noble gas sputter etch to remove the bread-loaf edges and to cause the etched material to redeposit in the gap, thereby allowing smaller gaps to be filled in fewer steps. The noble gas sputter etching bombards the first layer of ILD, ILD1 70, with noble gas ions 90. As shown in FIG. 13, after the medium-pressure noble gas sputter etching, PECVD is used to deposit another layer of ILD, ILD2 100, that completely fills the gap. The medium-pressure sputter etch is important to the efficient filling of submicron gaps under the present invention. The currently preferred embodiment of the present invention uses medium-pressure (80–200 mTorr) noble gas sputter etching.

In noble gas sputter etching, a noble gas is injected into a pressure-controlled sputtering chamber. An electric field is placed across the sputtering chamber with the water to be sputter etched placed at the negative potential. The noble gas atoms ionize in the electric field creating noble gas ions. The negatively charged electrons accelerate toward the positive potential, and the positively charged noble gas ions accelerate toward the wafer which is held at the negative potential. Upon colliding with the ILD on the surface of the wafer, the large noble gas ions knock the ILD material loose, thereby etching the ILD material. The ILD etch rate is preferentially high at the bread-loaf edges. A magnetic field may also be placed across the sputtering chamber to increase the percentage of noble gas atoms that become ionized, thereby increasing the noble gas sputtering rate. The magnetic field causes the free electrons to travel in a spiral path instead of a straight-line path, thereby increasing the probability of collision with a noble gas atom to cause further ionization.

The present invention comprises the use of predetermined ranges for three sputter etch parameters: pressure, power, and magnetic field. The pressure of the sputter chamber is an important parameter in enhancing submicron gap-filling. While using predetermined pressures to achieve complete gap filling, predetermined combinations of power and magnetic field may also be used to minimize transistor damage and optimize sputter etch rate.

The three sputter etch parameters (pressure, power, and magnetic field) influence the gap filling, the amount of gate-charging damage done to the transistors on the semiconductor wafer, and the etch rate. First, the pressure in the sputter etch chamber controls the collision rate of the noble gas ions. Increasing the sputter etch pressure acts to increase the redeposit of the etched material in the gaps. Second, increasing the power directly increases the strength of the electric field in the chamber which results in a higher acceleration of the noble gas ions causing the noble gas ions to impact the wafer surface with greater force. Therefore, increasing the power usually acts to increase the etch rate. But, if the power is increased too much the noble gas ions will cause gate-charging damage to the gate oxide of the transistors on the wafer. Third, increasing the magnetic field usually acts to increase the noble gas etch rate by producing more noble gas ions. Increasing the number of noble gas ions that impact the surface can also increase the amount of gate-charging damage to the gate oxide of the transistors on the wafer.

Of the three sputter etch control variables, pressure is currently believed to have the largest effect on submicron gap-filling capability. Changing the sputter etch pressure affects (1) the amount of etched ILD that redeposits in the gap, (2) the stability of the plasma, and (3) the uniformity of the etching. The practical ranges of settings for the pressure variable are: low (about 30–40 mTorr; typical prior art range), medium (about 80–200 mTorr; most effective in the present invention), and high (about 300–500 mTorr).

Sputter etching characteristics in the medium pressure range are:
1) increased redeposit of etched material in the gap,
2) less stable plasma, and
3) about 20% variation in etch uniformity.

The present invention uses pressures in the medium range because they provide sufficient stability of the plasma and sufficient uniformity of etching while increasing the amount of bread-loaf material that is etched and redeposited in the gap, thereby providing more effective filling of submicron gaps. The 20% non-uniformity in etching is acceptable because the advantage of efficient gap filling is gained.

The noble gas sputter etch parameters of power, pressure, and magnetic field interactively affect gap fill, transistor damage due to gate-charging, and etch rate. The following examples show the effects of sputter etch pressure, power, and magnetic field on gap fill, transistor damage due to gate-charging, and etch rate.

The examples show the invention as practiced with an Applied Materials Precision CVD system processing six-inch diameter wafers one at a time. It is apparent to one skilled in the art that in practicing the present invention the useful ranges of power, pressure, and magnetic field may be dependent on the equipment used, the number of wafers processed simultaneously, or the diameter of the individual wafers. The useful power range is believed to be dependent on the total upper surface area of the wafers processed which is determined by the number of wafers processed simultaneously and the diameter of the individual wafers. The useful pressure range is believed to be independent of the particular equipment used, the number of wafers processed simultaneously, and the diameter of the individual wafers. The useful magnetic field range is believed to be independent of the particular equipment used, the number of wafers processed simultaneously, and the diameter of the individual wafers.

Tables 1 shows the power settings used in the following examples and their normalized values of power per square centimeter of upper surface area for all wafers processed simultaneously.

TABLE 1

| Power | Normalized Power |
|---|---|
| 350 Watts | 1.9 W/cm$^2$ |
| 500 Watts | 3.0 W/cm$^2$ |

EXAMPLE 1

This example shows the effect of sputter etch pressure on gap filling. With the argon sputter etch parameters of power, pressure, and magnetic field set at 350 Watts, 40 mTorr, and 60 Gauss, respectively, filling of a 0.88 um gap is not complete, the argon sputter etch rate is about 5.0 angstroms per second, and the self-bias is about 530 Vdc Volts. The incomplete gap filling shown in the wafer cross-section of FIG. 3 was processed under these conditions. FIG. 4 shows complete gap filling of a cross-sectional view of wafer processed under the same conditions, except that the pressure is increased to 100 mTorr. With the argon sputter etch parameters of power, pressure, and magnetic field set at 350 Watts, 100 mTorr, and 60 Gauss, respectively, gap-filling of smaller than 0.70 um gaps is complete, the argon sputter etch rate is about 3.2 angstroms per second and the self-bias is about 505 Vdc Volts. The increased pressure improves gap fill, decreases the self-bias, and decreases the etch rate. The decreased etch rate is acceptable because gap fill is improved.

EXAMPLE 2

This example shows the effects of sputter etch power, pressure, and magnetic field on transistor damage due to gate-charging. Table 3 shows the amount of gate-charging damage for various combinations of the sputter etch parameters of power, pressure, and magnetic field.

TABLE 3

| Power | Pressure | Mag. Field | Gate-Charging |
|---|---|---|---|
| 550 Watts | 40 mTorr | 60 Gauss | High damage |
| 550 Watts | 100 mTorr | 60 Gauss | Lower damage |
| 350 Watts | 100 mTorr | 60 Gauss | No damage |

The data in table 3 indicate that power has the biggest effect on gate-charging while pressure has a smaller effect.

EXAMPLE 3

This example shows the effect of sputter etch power and magnetic field on etch rate. Table 4 shows the changes in sputter etch rate for various combinations of the sputter etch parameters of power, pressure, and magnetic field.

TABLE 4

| Power | Pressure | Mag. Field | Etch Rate |
|---|---|---|---|
| 550 Watts | 100 mTorr | 30 Gauss | 4.5 Angstroms/second |
| 550 Watts | 100 mTorr | 60 Gauss | 6.2 Angstroms/second |
| 350 Watts | 100 mTorr | 30 Gauss | 3.0 Angstroms/second |

The data in table 4 indicate that both power and magnetic field have significant effects on the sputter etch rate.

EXAMPLE 4

The currently preferred embodiment of the present invention sets the sputter etch parameters of power, pressure, and magnetic field at 350 Watts, 100 mTorr, and 60 Gauss, respectively to achieve complete filling of submicron gaps while minimizing the gate-charging damage and optimizing the etch rate. With the argon sputter etch parameters of power, pressure, and magnetic field set at 350 Watts, 100 mTorr, and 60 Gauss, respectively, submicron gap-filling is complete, the argon sputter etch rate is about 3.2 angstroms per second and there is no gate-charging damage. The lower etch rate is acceptable because gate-charging damage is avoided.

In summary, the currently preferred embodiment of the present invention, as shown in FIG. 2, is: (1) PECVD deposition of a first ILD layer to partially fill the submicron gaps between the metal lines as shown by block 20, (2) noble gas sputter etching the first ILD layer with the sputter etch parameters of power, pressure, and magnetic field set at about 350 Watts, about 80–200 mTorr, and about 60 Gauss, respectively, as shown by block 22, and (3) PECVD deposition of a second ILD layer to completely fill the submicron gaps between metal lines as shown by block 24.

Thus, an improvement to a method for filling submicron gaps between metal lines that may have imperfect geometries has been described.

What is claimed is:

1. In the field of semiconductor wafer processing, an improvement to a process for filling gaps between adjacent metal lines on a semiconductor wafer with an interlayer dielectric, ILD, comprising the steps of:
    depositing a first ILD layer using chemical vapor deposition, CVD, wherein said first ILD layer does not completely fill said gaps, wherein said gaps are submicron-wide, wherein said gaps have aspect ratios greater than 1.0, wherein said gaps may have reentrant angles;
    sputter etching said first ILD layer, said sputter etching being performed at a pressure such that a substantial amount of the etched ILD material is redeposited in said gaps, said sputter etching step following said depositing said first ILD layer step; and
    depositing a second ILD layer using CVD such that said gaps between said metal lines are completely filled.

2. The process as in claim 1, wherein said sputter etching uses argon, krypton, or xenon and said pressure is approximately 80–200 mTorr.

3. In the field of semiconductor wafer processing, an improvement to a process for filling gaps between adjacent metal lines on a semiconductor wafer with an interlayer dielectric, ILD, comprising the steps of:
    depositing a first ILD layer using chemical vapor deposition, CVD, wherein said ILD deposits preferentially on the upper edges of said metal lines to form bread-loaf edges, wherein said first ILD layer does not completely fill said gaps, wherein said gaps are submicron-wide, wherein said gaps have aspect ratios greater than 1.0, wherein said gaps may have reentrant angles;
    sputter etching said first ILD layer, said sputter etching being performed at a pressure such that said first ILD layer is preferentially etched at said bread-loaf edges and the etched material is redeposited in said gaps, said sputter etching step following said depositing said first ILD layer step; and
    depositing a second ILD layer using CVD such that said gaps between said metal lines are completely filled.

4. The process as in claim 3, wherein said sputter etching uses argon, krypton, or xenon and said pressure is approximately 80–200 mTorr.

5. In the field of semiconductor wafer processing, an improvement to a process for filling gaps between adjacent metal lines on a semiconductor wafer with an interlayer dielectric, ILD, comprising the steps of:
    depositing a first ILD layer using chemical vapor deposition, CVD, wherein said ILD deposits preferentially on the upper edges of said metal lines to form bread-loaf edges, wherein said first ILD layer does not completely fill said gaps, wherein said gaps are submicron-wide, wherein said gaps have aspect ratios greater than 1.0, wherein said gaps may have reentrant angles;
    sputter etching said first ILD layer, said sputter etching being performed using combinations of power, pressure, and magnetic field such that said first ILD layer is preferentially etched at said bread-loaf edges and the etched material is redeposited in said gaps to partially fill said gaps, said sputter etching step following said depositing said first ILD layer step; and
    depositing a second ILD layer using CVD such that said gaps between said metal lines are completely filled.

6. The process as in claim 5, wherein said sputter etching uses argon, krypton, or xenon and said combinations of power, pressure, and magnetic field are approximately 1.9–3.0 Watts/(cm$^2$ of upper wafer area), approximately 80–200 mTorr, and approximately 30–60 Gauss, respectively.

7. In the field of semiconductor wafer processing, an improvement to a process for filling gaps between adjacent metal lines on a semiconductor wafer with an interlayer dielectric, ILD, comprising the steps of:
    depositing a first ILD layer using plasma enhanced chemical vapor deposition, PECVD, with either TEOS or silane as the silicon source, wherein said ILD deposits preferentially on the upper edges of said metal lines to form bread-loaf edges, wherein said first ILD layer does not completely fill said gaps, wherein the widths of said gaps are less than 0.8 um, wherein the aspect ratios of said gaps are greater than 1.0, wherein said gaps may have a reentrant angle;
    sputter etching said first ILD layer, said sputter etching being performed using combinations of power, pressure, and magnetic field such that said first ILD layer is preferentially etched at said bread-loaf edges and the etched material is redeposited in said gaps to partially fill said gaps, said sputter etching step following said depositing said first ILD layer step; and
    depositing a second ILD layer using PECVD such that said gaps between said metal lines are completely filled.

8. The process as in claim 7, wherein said sputter etching is argon sputter etching and said combinations of power, pressure, and magnetic field are approximately 1.9–3.0 Watts/(cm$^2$ of upper wafer area), approximately 80–200 mTorr, and approximately 30–60 Gauss, respectively.

9. The process as in claim 7, wherein said widths of said gaps are less than 0.70 um, wherein said sputter etching uses krypton or xenon, and wherein said combinations of power, pressure, and magnetic field are approximately 1.9–3.0 Watts/(cm$^2$ of upper wafer area), approximately 80–200 mTorr, and approximately 30–60 Gauss, respectively.

10. In the field of semiconductor wafer processing, an improvement to a process for filling gaps between adjacent metal lines on a semiconductor wafer with an interlayer dielectric, ILD, wherein said semiconductor wafer has transistors, comprising the steps of:

depositing a first ILD layer using chemical vapor deposition, CVD, wherein said ILD deposits preferentially on the upper edges of said metal lines to form bread-loaf edges, wherein said first ILD layer does not completely fill said gaps, wherein said gaps are submicron-wide, wherein said gaps have aspect ratios greater than 1.0, wherein said gaps may have reentrant angles;

sputter etching said first ILD layer, said sputter etching being performed using combinations of power, pressure, and magnetic field such that said first ILD layer is preferentially etched at said bread-loaf edges and the etched material is redeposited in said gaps to partially fill said gaps and such that said combinations of power, pressure, and magnetic field minimize the damage to the transistors on said wafer caused by said sputter etching, said sputter etching step following said depositing said first ILD layer step; and depositing a second ILD layer using CVD such that said gaps between said metal lines are completely filled.

11. The process as in claim 10, wherein said sputter etching uses argon, krypton, or xenon and said combinations of power, pressure, and magnetic field are approximately 1.9–3.0 Watts/(cm$^2$ of upper wafer area), approximately 80–200 mTorr, and approximately 30–60 Gauss, respectively.

12. In the field of semiconductor wafer processing, an improvement to a process for filling gaps between adjacent metal lines on a semiconductor wafer with an interlayer dielectric, ILD, wherein said semiconductor wafer has transistors, comprising the steps of:

depositing a first ILD layer using plasma enhanced chemical vapor deposition, PECVD with either TEOS or silane as the silicon source, wherein said ILD deposits preferentially on the upper edges of said metal lines to form bread-loaf edges, wherein said first ILD layer does not completely fill said gaps, wherein the widths of said gaps are less than 0.8 um, wherein the aspect ratios of said gaps are greater than 1.0, wherein said gaps may have a reentrant angle;

sputter etching said first ILD layer, said sputter etching being performed using combinations of power, pressure, and magnetic field such that said first ILD layer is preferentially etched at said bread-loaf edges and the etched material is redeposited in said gaps to partially fill said gaps and such that said combinations of power, pressure, and magnetic field minimize the damage to the transistors on said wafer caused by said sputter etching, said sputter etching step following said depositing said first ILD layer step; and depositing a second ILD layer using PECVD such that said gaps between said metal lines are completely filled.

13. The process as in claim 12, wherein said sputter etching is argon sputter etching and said combinations of power, pressure, and magnetic field are approximately 1.9–3.0 Watts/(cm$^2$ of upper wafer area), approximately 80–200 mTorr, and approximately 30–60 Gauss, respectively.

14. The process as in claim 12, wherein said widths of said gaps are less than 0.70 um, wherein said sputter etching uses krypton or xenon, and wherein said combinations of power, pressure, and magnetic field are approximately 1.9–3.0 Watts/(cm$^2$ of upper wafer area), approximately 80–200 mTorr, and approximately 30–60 Gauss, respectively.

15. In the field of semiconductor wafer processing, an improvement to a process for filling gaps between adjacent metal lines on a semiconductor wafer with an interlayer dielectric, ILD, wherein said semiconductor wafer has transistors, comprising the steps of:

depositing a first ILD layer using chemical vapor deposition, CVD, wherein said ILD deposits preferentially on the upper edges of said metal lines to form bread-loaf edges, wherein said first ILD layer does not completely fill said gaps, wherein said gaps are submicron-wide, wherein said gaps have aspect ratios greater than 1.0, wherein said gaps may have reentrant angles;

sputter etching said first ILD layer, said sputter etching being performed using combinations of power, pressure, and magnetic field such that said first ILD layer is preferentially etched at said bread-loaf edges and the etched material is redeposited in said gaps to partially fill said gaps and such that said combinations of power, pressure, and magnetic field minimize the damage to the transistors on said wafer caused by said sputter etching, said combinations also maximizing the etch rate of said sputter etching to the extent possible without damaging the transistors, said sputter etching step following said depositing said first ILD layer step; and depositing a second ILD layer using CVD such that said gaps between said metal lines are completely filled.

16. The process as in claim 15, wherein said sputter etching uses argon, krypton, or xenon and said combinations of power, pressure, and magnetic field are approximately 1.9–3.0 Watts/(cm$^2$ of upper wafer area), approximately 80–200 mTorr, and approximately 30–60 Gauss, respectively.

17. In the field of semiconductor wafer processing, an improvement to a process for filling gaps between adjacent metal lines on a semiconductor wafer with an interlayer dielectric, ILD, wherein said semiconductor wafer has transistors, comprising the steps of:

depositing a first ILD layer using plasma enhanced chemical vapor deposition, PECVD with either TEOS or silane as the silicon source, wherein said ILD deposits preferentially on the upper edges of said metal lines to form bread-loaf edges, wherein said first ILD layer does not completely fill said gaps, wherein the widths of said gaps are less than 0.8 um, wherein the aspect ratios of said gaps are greater than 1.0, wherein said gaps may have a reentrant angle;

sputter etching said first ILD layer, said sputter etching being performed using combinations of power, pressure, and magnetic field such that said first ILD layer is preferentially etched at said bread-loaf edges and the etched material is redeposited in said gaps to partially fill said gaps and such that said combinations of power, pressure, and magnetic field minimize the damage to the transistors on said wafer caused by said sputter etching, said combinations also maximizing the etch rate of said sputter etching to the extent possible without damaging the transistors, said sputter etching step following said depositing said first ILD layer step; and depositing a second ILD layer using CVD such that said gaps between said metal lines are completely filled.

18. The process as in claim 17, wherein said sputter etching is argon sputter etching and said combinations of power, pressure, and magnetic field are approximately 1.9–3.0 Watts/(cm$^2$ of upper wafer area), approximately 80–200 mTorr, and approximately 30–60 Gauss, respectively.

19. The process as in claim 17, wherein said widths of said gaps are less than 0.70 um, wherein said sputter etching uses krypton or xenon, and wherein said combinations of power, pressure, and magnetic field are approximately 1.9–3.0 Watts/(cm$^2$ of upper wafer area), approximately 80–200 mTorr, and approximately 30–60 Gauss, respectively.

* * * * *